Dec. 22, 1970 L. L. WILLIAMS 3,550,113

CURRENT-MODE ANALOG-TO-DIGITAL CONVERTER

Filed Nov. 15, 1967 2 Sheets-Sheet 1

INVENTOR.
LARRY L. WILLIAMS

BY Fraser and Bogucki

ATTORNEYS

CURRENT-MODE ANALOG-TO-DIGITAL CONVERTER

INVENTOR.
LARRY L. WILLIAMS
BY Fraser and Bogucki
ATTORNEYS

United States Patent Office 3,550,113
Patented Dec. 22, 1970

3,550,113
CURRENT-MODE ANALOG-TO-DIGITAL CONVERTER

Larry L. Williams, Mountain View, Calif., assignor to International Business Machines Corporation, Armonk, N.Y., a corporation of New York Filed Nov. 15, 1967, Ser. No. 683,316
Int. Cl. H03k *13/04*
U.S. Cl. 340—347 13 Claims

ABSTRACT OF THE DISCLOSURE

An analog-to-digital converter of the successive approximation type in which one or more continuously flowing currents in a plurality of circuit paths are applied to a comparator as a reference current and selectively or successively compared with analog input currents to provide a digital representation. The currents in each of the various paths, which are defined by a resistive network, are selectively diverted by converter logic between alternate minimum impedance paths, one of which is coupled to the comparator. Relatively little if any changes occur in the voltages or current throughout the network, which may be of the R–2R ladder type, and time delays in the conversion process due to stray capacitance and resistor inductance are minimized.

BACKGROUND OF THE INVENTION

The present invention relates to analog-to-digital converters, and more particularly to converters of the successive approximation type wherein one or more signals are compared with unknown analog values to provide digital representations thereof.

Description of the prior art

Analog-to-digital converters have become a necessary part of many data processing and computation operations, and have additionally found widespread application in many other fields, both related and unrelated. Such converters may assume a number of different forms and may operate in a number of different manners, the suitability of a particular converter for an application being determined by factors such as speed, cost and reliability. Converters which work on a successive approximation principle are most used for data processing and related operations where factors such as high speed and high reliability are very desirable.

In general, successive approximation type converters successively or selectively compare analog input signals with a reference signal, the value of the reference signal being changed in systematic fashion until it approximates or is equal to the particular input signal being used as the reference for comparison. At the completion of the comparison process, a digital representation of the reference signal provides the desired equivalent of the analog input signal. Such converters may be looked upon as being both analog-to-digital and digital-to-analog in nature. They are analog-to-digital in an external sense, because the input end receives signals in analog form and the output end provides equivalent signals in digital form. In an internal sense, however, they are digital-to-analog since upon completion of a conversion of the analog signal representative of the complete digital value is used as a reference signal. In the following description, this equivalence should be understood although the description principally refers to the analog-to-digital converter type.

The analog input values are typically represented as input voltages to the converter, which voltages are compared with reference voltages during the successive approximation. Where a plurality of different channels are selectively coupled to the converter input, the analog voltages present at the various channels are individually converted by a successive or selective multiplexing process. The circuitry and associated equipment and components are relatively complex, a factor which may be a serious limitation in systems in which space and cost are important considerations. Moreover, the overall conversion rate is often seriously impaired by the time required to change the value of the reference voltage during successive approximation. In the circuitry that generates the reference voltages, voltage swings at the various nodes within the circuit require additional energy to compensate for the various stray capacitances that are present in such circuitry. As the corresponding current values within the circuit also change, energy is required to compensate for the inductance of components such as the numerous resistors normally present in the circuit. The practical result is a considerable reduction in the speed of operation of the converter, with a corresponding reduction in the capabilities and data handling capacities of the associated equipment. For example, the top operating conversion rate of a system may be limited to 30,000 to 40,000 conversions per second even though the system is otherwise capable of operating at rates of 200,000 or even 500,000 conversions per second.

Ideally, then, an analog-to-digital converter of the successive approximation type should be capable of reliably converting analog input signals at extremely high conversion rates which are unhampered by stray capacitive and inductive effects in the circuitry. The overall cost of the converter should be held to a minimum, ideally by reducing the complexity of some of the converter components such as the multiplexing equipment. Circuitry such as that used for generating the reference signal should be relatively simple and inexpensive, and preferably should make use of low-cost circuits which are commercially available in pre-assembled form.

BRIEF DESCRIPTION OF THE INVENTION

In brief, the present invention provides an analog-to-digital converter of the successive approximation type in which current equivalents of analog input voltages are compared with reference currents generated by a relatively simple, high speed circuit. Little or no voltage and current changes occur at the various nodes throughout the reference current generating circuit as the value of the reference current is changed during comparison, providing conversion rates greatly in excess of those now realizable with conventional reference voltage or current generating circuitry. Relatively simple voltage-to-current converters which are used to provide the current equivalents of the analog input voltages additionally provide load buffering for the converter, and the current equivalents are readily processed, using simplified multiplexing techniques.

In accordance with particular aspects of the invention, the reference current comprises one or more of a plurality of constant currents which are selectively diverted away from a plurality of active circuit elements when such elements assume a particular state of conductivity as determined by converter logic. A plurality of passive circuit elements associated with different ones of the active circuit elements assumes different states of conductivity in accordance with the bias level thereon, the bias level being varied in accordance with the state of conductivity of the associated active circuit elements. When one or more of the active circuit elements is rendered non-conductive by the converter logic, the bias level of the associated passive circuit element is altered so that the passive circuit element conducts, diverting the current to or from a comparator.

In accordance with further particular aspects of the invention, the constant currents are provided by a resistive network having a plurality of parallel current paths, and the constant currents continuously flow in the different paths. The active and passive circuit elements respectively comprise switching transistors and semiconductor diodes. The current normally flows through the conducting transistors, but is selectively diverted through the associated semiconductor diodes when particular transistors are rendered non-conducting. The transistors and diodes define alternate paths of minimum impedance, and the continuous current flows and resulting constant voltages within the current paths are not subject to changes as the currents are selectively switched to change the value of the reference current.

In accordance with one preferred embodiment of a reference current generating circuit in accordance with the invention, the resistive network comprises an R–2R ladder network, the total impedance of which remains constant providing little or no adverse effect on a constant current source coupled to the various network paths. The various resistors of R–2R size have sufficiently small resistance such that they can be precision made at relatively low cost.

BRIEF DESCRIPTION OF THE DRAWINGS

The foregoing and other objects, features and advantages of the invention will be apparent from the following more particular description of preferred embodiments of the invention, as illustrated in the accompanying drawings.

DETAILED DESCRIPTION

Figure 1:
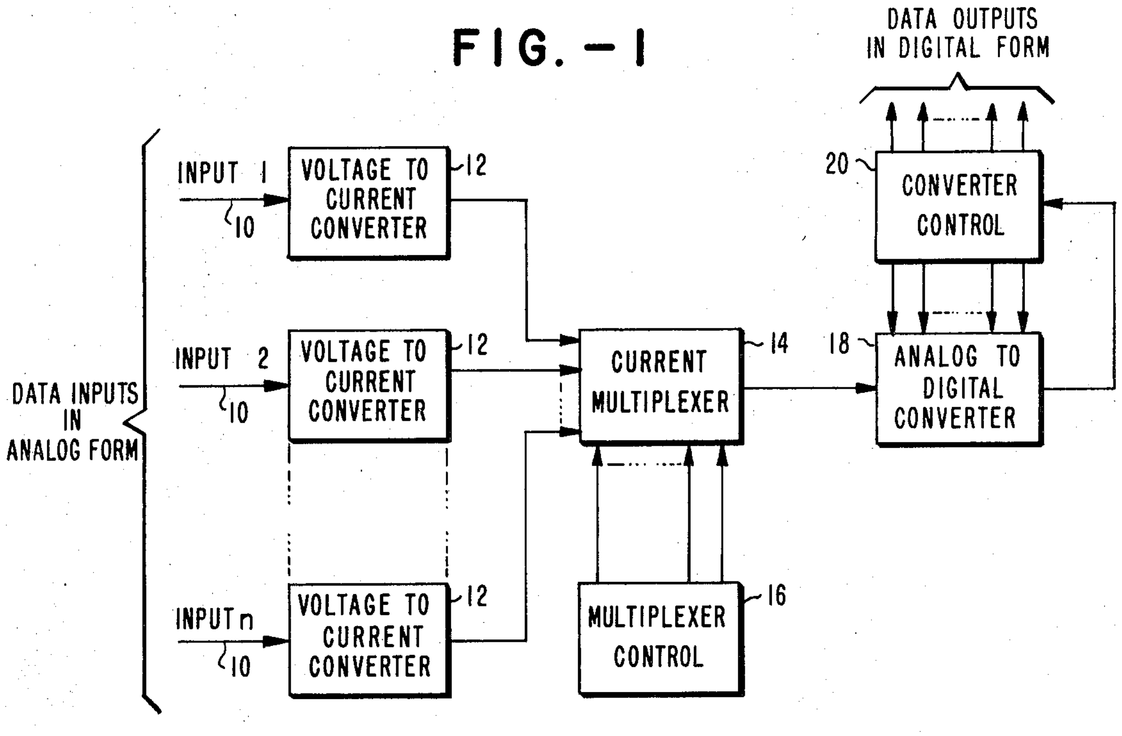
FIG. 1 is a generalized block diagram of an analog to digital converter of the successive approximation type in accordance with the invention.

FIG. 1 represents an analog-to-digital converter in accordance with the invention that may be employed for example in a process control system having analog input sub-systems. The process sub-systems receive process data in analog form, which data must be converted into digital form for use in the digital process control system. The analog inputs in this instance comprise analog voltages appearing on separate input leads 10, as shown in FIG. 1. Any number of analog input voltages may be converted, using the single converter of FIG. 1, the number being limited only by factors such as the capability of the multiplexing equipment. For the sake of simplicity, only three such inputs are illustrated in FIG. 1.

The analog input voltages are converted to equivalent currents by a plurality of voltage-to-current converters 12, and applied to the input of a current multiplexer 14 which is governed by a multiplexer control 16 to selectively or successively apply each such current to an analog-to-digital converter 18. The converter 18 operates under the command of a converter control 20 to successively change the value of a generated reference current, the reference current being compared with the analog input current after each value change, and the results of such comparisons being used to set bits into a register within the converter control 20. The output of the register within the converter control 20 provides the desired digital representation of the analog input current upon coincidence.

Figure 2:
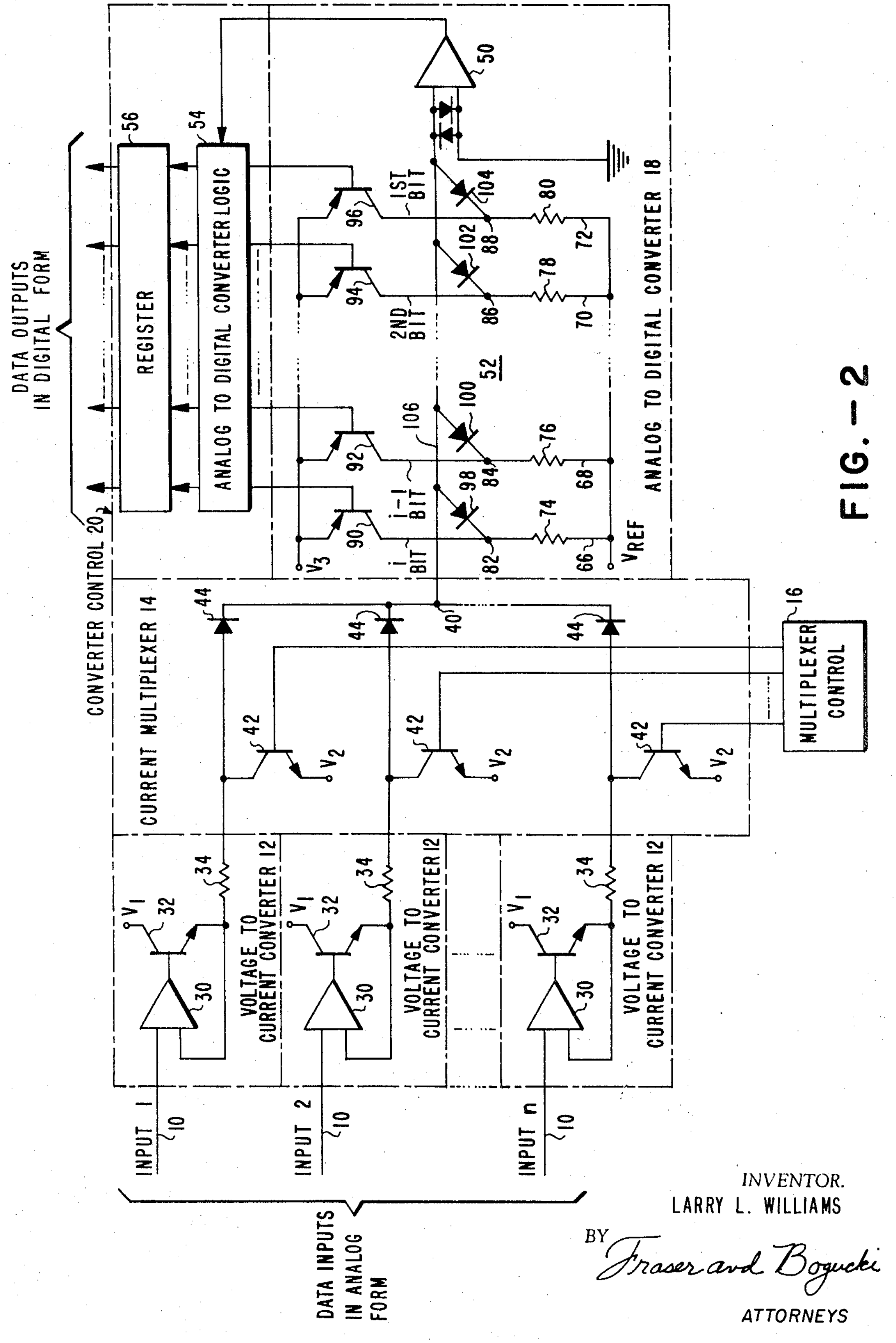
FIG. 2 is a schematic diagram of the converter of FIG. 1 showing one particular arrangement of a reference current generating circuit.

The details of much of the converter arrangement of FIG. 1 are illustrated schematically in FIG. 2. Each of the voltage-to-current converters 12 includes an amplifier 30, one input of which is coupled to an input lead 10 to receive the analog input voltage and the output of which is coupled to the base of a transistor driver 32. The collector terminal of the transistor drive 32 is coupled to a voltage source $V_1$ and the emitter terminal is coupled to a comparison resistor 34 and to a second input of the amplifier 30 to form a feedback loop. The gain of the implifier 30 is chosen to be relatively high. Accordingly, the voltages at the two input terminals thereof are approximately equal and the voltage at the output terminal is close to ground. The current through the comparison resistor 34 is thus approximately equal to the analog input voltage divided by the resistance thereof, and therefore represents the analog value of the corresponding input voltage. The converters 12 are relatively simple circuit arrangements, the cost of which may be minimized by using small integrated circuit or hybrid amplifiers as the amplifiers 30. Separate circuitry to provide load buffering is unnecessary because this function is also performed by the amplifier 30.

The analog input currents from the converters 12 are selectively or sequentially passed to the input terminal 40 of the analog-to-digital converter 18 by the multiplexer 14 under the control of the multiplexer control 16. A plurality of shunting transistors 42 individually coupled between the output of each converter 12 and a source of potential $V_2$ shunt the respective analog currents away from the converter input terminal 40 when conducting. When one of the transistors 42 is rendered non-conductive by the multiplexer control 16, the corresponding analog current is passed through a diode 44 and into the analog-to-digital converter 18 via the input terminal 40.

The analog current at the converter input terminal 40 is compared in a comparator 50 with a reference current provided by a reference current generating circuit 52, the results of such comparison being fed to a converter logic circuit 54. The logic circuit 54 successively changes the value of the reference current while supplying bits to an associated register 56. Upon coincidence at the comparator 50, the stored bits in the register 56 provide a digital representation of the particular analog input voltage being converted.

The reference current generating circuit 52 includes a plurality of parallel current paths 66, 68, 70 and 72, each of which includes a different resistor 74, 76, 78 and 80, respectively. The current paths 72 and 70 correspond to the first and second bits respectively, while the paths 66 and 68 correspond to the highest order or "*i*" bit and the next to the highest order or "*i*–1" bit respectively. The value of each of the resistors 74, 76, 78 and 80 is chosen to provide a current in the associated path corresponding to the particular bit which the path represents. Thus the resistors 78 and 80 are of relatively large resistance values providing the small currents appropriate for the respective first and second bits of the multi-digit binary output, while the resistors 74 and 76 are appropriately small in relative value to provide the large currents required for the "*i*" bit and the "*i*–1" bit.

One end of each of the parallel current paths 66, 68, 70 and 72 is coupled to a common source of potential $V_{REF}$. The other ends of the current paths are coupled to terminals 82, 84, 86 and 88 respectively. The terminals 82, 84, 86 and 88 are coupled to a source of potential $V_3$ through a first plurality of circuit paths which include the emitter and collector leads of a plurality of transistors 90, 92, 94 and 96 respectively. The terminals 82, 84, 86 and 88 are also coupled through a second plurality of circuit paths which include respective diodes 98, 100, 102 and 104, and a common bus 106 to a common input of the comparator 50. The values of the sources of potential $V_3$ and $V_{REF}$ are chosen such that when one or more of the transistors is conducting, the associated diodes are reverse-biased preventing current flow from the common comparator input to the associated current path terminals. When one or more of the transistors is rendered nonconductive however, the associated diodes are forward-biased and pass current from the common comparator input.

It will therefore be seen that in accordance with the invention a reference current of digitally variable amplitude is comprised of one or more of a plurality of constant currents of digitally varying amplitudes. The constant currents are caused to flow in a plurality of current paths which may be defined by the various legs of a resistive network. Each current path is coupled to pass its constant current through a different one of a plurality of active circuit elements when the element assumes one of two different states of conductivity under the control of converter logic. Each current path and associated active circuit element is coupled to a different one of a plurality of passive circuit elements to vary the bias level on the passive circuit element. The passive circuit elements are capable of assuming either of two different states of conductivity in accordance with the bias level thereon. When one or more of the active circuit elements are caused to assume the other of their two different states of conductivity under the control of the converter logic, the bias levels on the associated passive circuit elements are varied to cause the assumption of the other of the different states of conductivity of the passive elements thereby diverting the associated constant currents therethrough. The passive circuit elements are coupled to a common input of the comparator so as to combine the various currents passing therethrough.

In the arrangement shown in FIG. 2 the active circuit elements comprise switching transistors, the states of which conveniently define the two different conductivity conditions. The passive circuit elements comprise semiconductor diodes having either a conductive or non-conductive state. Each semiconductor diode is rendered conducting by imposition of a forward bias of predetermined level. When the associated switching transistors are conducting, the bias level is changed so as to render the diodes non-conductive. The switching transistors may be coupled in the circuit in either sense, and the semiconductor diodes may be poled in either direction so as to pass currents toward or away from the common comparator input depending upon the particular arrangement of the reference current generating circuit.

Figure 3:
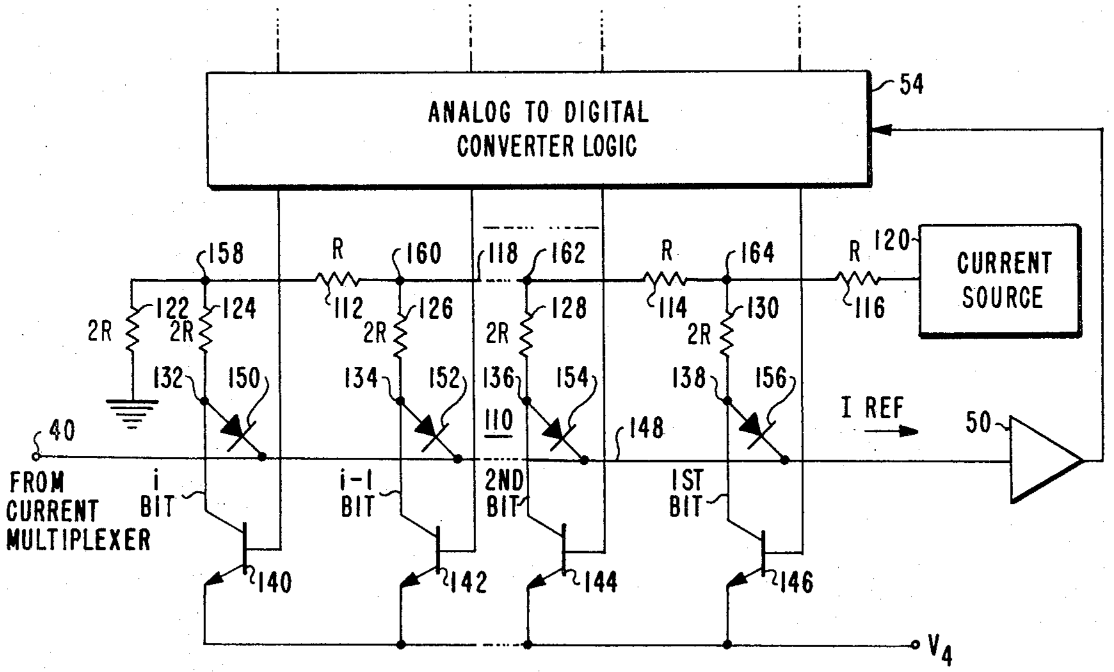
FIG. 3 is an illustration, partly in schematic and partly in block diagram form, of a preferred circuit arrangement for generating a reference current in accordance with the invention.

Thus in the arrangement of FIG. 2 the transistors 90 92, 94 and 96 and the diodes 98, 100, 102 and 104 are coupled in a manner so as to pass the constant currents from the source of potential $V_3$, or alternatively from a common input of the comparator 50, to the terminals 82, 84, 86 and 88. In a different arrangement of a reference current generating circuit, as illustrated in FIG. 3 and discussed hereinafter, the switching transistors and semiconductor diodes are arranged to pass the constant currents from the terminals at the ends of the parallel current paths into the transistors or alternatively into a common input of the comparator. Although the alteration of the bias level on the diodes is a threshold-type operation, the voltage swings within each transistor as it operates under the command of converter logic are such that there is no departure from a binary-type operation.

Successive approximation in the arrangement of FIG. 2 begins with the converter logic circuit 54 turning off the transistor 90 associated with the highest order or "*i*" bit current path 66. This action removes the reverse bias from the associated diode 98, drawing a current from the common comparator input through the resistor 74 to the source of potential $V_{REF}$. If this current, the value of which is determined by the value of the resistor 74, is larger than the input analog current being compared, the output of the comparator 50 becomes negative and registers a logical "0" in the logic circuit 54 and at the register 56. The logic circuit 54 then turns on the transistor 90, and turns off the transistor 92 corresponding to the second highest order or "*i*–1" bit. If the "*i*" bit comparison results in a logical "1" rather than a logical "0," then the transistor 90 is left off during the completion of the conversion. The logic circuit 54 steps through the various current paths 66, 68, 70 and 72 sequentially comparing the currents at the comparator 50 input and transferring the appropriate bits into the data register 56. When a reference current value is found which equals or approximates the value of the analog input current, the comparison is complete and the bits stored in the register 56 provide the desired data output in digital form. The muliplexer control 16 then turns on the transistor 42 corresponding to the signal just converted and turns off another one of the transistors 42 in preparation for the next conversion.

It will be noted that the voltages within the reference current generating circuit 52 vary only slightly during the conversion, due to changes in the voltage drops across the transistors 90, 92, 94 and 96, the transistors 42 within the current multiplexer 14, and the diodes 98, 100, 102 and 104. If the values of the sources of potential $V_3$ and $V_{REF}$ are made relatively small, the voltage swings within the circuit 52 are inconsequential and the continuously flowing current in each of the paths 66, 68, 70 and 72 remains substantially constant and independent of the switching of the various paths. As a result, the energy required to change the voltage across any stray capacitances in the circuit 52 during the conversion process is slight, and the speed of conversion is greatly increased. Moreover, because changes in the currents in the paths 66, 68, 70 and 72 are slight, if any, the corresponding inductive effect of the resistors 74, 76, 78 and 80 on the speed of conversion is minimal. The diodes 98, 100, 102 and 104 and the resistors 74, 76, 78 and 80 are chosen to have minimum leakage and stored charge.

While the particular reference current generating circuit 52 shown in FIG. 2 provides very high conversion rates by minimizing current and voltage changes therein during conversion, such circuit involves one practical limitation. As previously noted, the resistors 74, 76, 78 and 80 are of different values and are selected to provide a desired current magnitude corresponding to the particular bit which each represents. As a result, those resistors, such as resistors 78 and 80, which correspond to the lower order bits, must be relatively large. In some situations, the values of such lower bit order resistors may be sufficiently high so as to militate against the use of precision resistors.

A preferred arrangement of a circuit for generating the reference current in accordance with the invention, which provides for the use of a conventional R–2R ladder network having relatively low resistor values, is illustrated in FIG. 3. In this arrangement, resistors of only two different sizes are required, both sizes being relatively small. Moreover, because a number of R–2R ladder arrangements are commercially available one or more of such arrangements can be easily adapted for use in a converter in accordance with the invention with a minimum of effort and cost.

The reference current generating circuit 110 shown in FIG. 3 employs a R–2R ladder network which includes a plurality of resistors 112, 114 and 116 of value R serially coupled in a lead 118, one end of which is coupled to a source 120 of constant current and the other end of which is coupled to ground through a resistor 122 of value 2R. A plurality of resistors 124, 126, 128 and 130 of value 2R are respectively coupled between a plurality of terminals 132, 134, 136 and 138 and the junctions between respective ones of the plurality of resistors 112, 114 and 116 to define parallel current paths. Current from the source 120 flows along the lead 118 and into the various current paths defined by the resistors 124, 126, 128 and 130 to the terminals 132, 134, 136 and 138. Current also, of course, flows through the 2R resistor 122 to ground. The terminals 132, 134, 136 and 138 are coupled to a source of potential $V_4$ thorugh a first plurality of circuit paths which include the collector and emitter leads of a plurality of transistors 140, 142, 144 and 146 respectively. The terminals 132, 134, 136 and 138 are also coupled to a common input of the comparator 50 through a second plurality of circuit paths which include a common bus 148 and a plurality of diodes 150, 152, 154 and 156 respectively. The source of potential $V_4$ and the potential of the constant current source 120 are chosen such that when one or more of the transistors are conducting, the associated diodes are reverse-biased preventing current flow from the terminals 132, 134, 136 and 138 to the input of the comparator 50. When one or more of the transistors 140, 142, 144 and 146 is rendered non-conductive by the converter logic circuit 54 through a change in the bias on the base lead thereof, the associated diodes become forward-biased, passing current from the terminals to the common input of the comparator 50. The current paths which include the resistors 124 and 126 correspond to the highest or "$i$" bit and the next to the highest "$i-l$" bit respectively. The paths which include the resistors 128 and 130 correspond to the second and first bits respectively.

When an analog current which is to be compared appears at the input terminal 40, the converter logic circuit 54 turns off the transistor 140 corresponding to the highest order or "$i$" bit forward-biasing the associated diode 150. Current at the terminal 132 is thereby directed through the diode 150 and along the common bus 148 to the input of the comparator 50, where it is compared with the analog input current. The comparator 50 in this instance is a current comparator comprising an amplifier having a a low input impedance. Because the analog input current and the reference current both utilize the common bus 148 and appear at a common input terminal of the amplifier, comparison is achieved by amplifying any current which flows into or out of the amplifier input. The converter logic circuit 54 successively approximates the value of the analog input current by selectively turning the transistors 140, 142, 144 and 146 off and on until a reference current is provided which equals or approximates the analog input current. When coincidence occurs, the bits stored in the associated register 56 (not shown in FIG. 3) provide the desired output in digital form.

The first and second plurality of circuit paths defined by the transistors and diodes respectively are of minimum impedance. Moreover, the input terminal of the comparator 50 is very close to ground potential, and the source of potential $V_4$ is also very close to ground potential being very slightly negative in most instances. The voltages within the circuit 110 vary only slightly during conversion, due to changes in the voltage drops across the transistors 140, 142 ,144 and 146 and the diodes 150, 152, 154 and 156. In view of this and due to the fact that all of the resistors of value R and 2R remain constant in value, the currents continuously flowing through the parallel paths defined by the resistors 124, 126, 128 and 130 remain substantially constant in value regardless of which of the two alternate current paths the current is diverted into. The effects of stray capacitances and inductances on the operating speed of the circuit are accordingly minimized, and the circuit is capable of extremely high speeds of operation greatly exceeding those possible with conventional reference signal generating circuits.

Several advantages are realized by using a ladder network of the R–2R type. Such a network is commercially available in various forms and is easily used in an arrangement such as that shown in FIG. 3 without extensive redesign or expense. The various resistors of value R and 2R are relatively low in value, and can be precision made on an economical basis.

In many conventional circuit arrangements, it is difficult to maintain the current from the current source at a constant value, due to impedance changes within the circuit. Thus, although current sources typically have high impedances which ideally approach infinite levels, for all practical purposes such sources have an impedance of some fixed, finite value. If the impedance of the circuit to which the current source is connected changes as the impedance of the source itself remains fixed, the value of the current from the source also changes, providing undesirable current and voltage changes throughout the circuit. The R–2R ladder network avoids this problem by providing constant and equal impedances between ground and each of a plurality of circuit nodes 158, 160, 162 and 164 which define the junctions between the resistors of R value. This may be shown by assuming that the source of potential $V_4$ is at ground level, such that each of the terminals 132, 134, 136 and 138 is at ground potential when the associated transistor is conducting. If the transistor 140 corresponding to the "$i$" bit is turned off, coupling the terminal 132 to the input of the comparator 50, the total impedance between the node 158 and ground is equal to 2R. If the transistor 140 is turned on and the transistor 142 is turned off, the total impedance between the node 160 and ground is determined by the resistor 112 in series with the parallel combination of the resistors 122 and 124, and is again equal to 2R. If the transistor 142 is turned on and the transistor 146 corresponding to the first bit is turned off, the impedance between the node 164 and ground may again be shown to be equal to 2R.

Because the various circuit impedances always remain constant, the current from the source 120 remains substantially constant to provide currents of fixed value in the various parallel current paths. The flow of current in each path is selectively diverted between the source of potential $V_4$ and the comparator 50 input with little or no change in value.

While the invention has been particularly shown and described with reference to preferred embodiments thereof, it will be understood by those skilled in the art that various changes in form and details may be made therein without departing from the spirit and scope of the invention.

What is claimed is:

1. A circuit for generating a reference current of digitally variable amplitude comprising a plurality of terminals, a plurality of current sources providing constant currents of digitally varying amplitudes to different ones of the plurality of terminals, a first plurality of current paths coupled to different ones of the plurality of terminals, each of the first plurality of current paths including a different one of a plurality of active circuit elements, each of the active circuit elements being controllable to pass the constant current provided to the associated terminal therethrough when in a first state and to prevent the constant current from passing therethrough when in a second state, a second plurality of current paths coupled to different ones of the plurality of terminals, each of the second plurality of current paths including a different one of a plurality of passive circuit elements, each of the passive circuit elements being responsive to the active circuit element in that one of the first plurality of current paths coupled to the associated terminal to be biased into nonconduction and prevent the constant current provided to the associated terminal from passing therethorugh when the active circuit element is in the first state and to be biased into conduction and pass the constant current provided to the associated terminal therethrough when the active circuit element is in the second state, the first and second current paths coupled to each of the plurality of terminals presenting alternate paths of minimum, substantially like impedance to maintain the current provided at the terminal substantially constant for flow through either of the alternate paths.

2. A circuit for generating a reference current of digitally variable amplitude comprising a plurality of sources of constant currents of digitally varying amplitudes, a plurality of active circuit elements, each being coupled to a different one of the plurality of sources and controllable to pass the constant current from the source therethrough when conductive and to block the constant current from the source when nonconductive, a plurality of passive unidirectional circuit elements, each being coupled to a different one of the plurality of sources, and having a predetermined forward bias level establishing conductivity therein, the forward bias of each passive unidirectional circuit element varying in response to the state of the active circuit element coupled to the associated one of the plurality of sources such that the forward bias renders the passive unidirectional circuit element nonconductive when the associated active circuit element is conductive and the forward bias level is changed when the associated active circuit element becomes nonconductive to render the passive unidirectional circuit element conductive and divert the constant current from the associated one of the plurality of sources therethrough.

3. In an analog-to-digital converter, a circuit for providing a reference current of digitally variable amplitude under the command of a converter logic circuit, comprising a plurality of switching transistors, each transistor being controlled by the converter logic circuit to operate either in a state of conduction or a state of nonconduction, a resistive network defining a plurality of parallel current paths, means coupled to the resistive network for providing constant currents of digitally varying amplitudes in the parallel current paths, means for passing the constant current from each parallel current path through a different one of the switching transistors when said transistors are in a state of conduction, a plurality of semiconductor diodes, each diode being associated with a different one of the switching transistors and having a forward bias which varies in accordance with the state of conduction of the associated switching transistor, nonconduction of the switching transistor changing the forward bias such that the diode conducts to divert the constant current therethrough, and means coupled to said semiconductor diodes for combining the currents therefrom, each of said switching transistors presenting a minimum impedance path for the associated constant current when conducting, and each of said semiconductor diodes presenting an alternate minimum impedance path for the associated constant current when conducting.

4. An analog-to-digital converter of the successive approximation type for converting one or more DC analog input voltages into digital values; comprising means for converting each of the DC analog input voltages into a DC current of equivalent value; means for generating a reference current; means for comparing each equivalent value current with the reference current; means responsive to the comparing means and coupled to the reference current generating means for changing the value of the reference current until it is substantially equal to the equivalent value current being compared; and means coupled to the value changing means for providing a digital representation of the reference current when it is substantially equal to the equivalent value current being compared; said reference current generating means including a plurality of sources of constant current of digitally varying amplitudes, a first plurality of minimum impedance current paths, each of which is coupled to a different one of the constant current sources to provide a path for the flow of the constant current therefrom, a second plurality of minimum impedance current paths, each of which is coupled between a different one of the constant current sources and the comparing means, and switching means associated with each constant current source and responsive to the reference current value changing means to selectively apply the constant current from the associated constant current source to the associated second minimum impedance current path for application to the comparing means, the constant current from each constant current source continuously flowing in one of the associated first and second minimum impedance current paths.

5. A converter in accordance with claim 4, wherein each switching means includes a diode coupled in the associated second minimum impedance current path between the associated constant current source and the comparing means; and a transistor coupled in the associated first minimum impedance current path to reverse bias the diode when conducting and to forward bias the diode when not conducting.

6. A converter in accordance with claim 5, further including first and second potential sources, a third plurality of current paths coupled to the first potential source and forming the plurality of constant current sources, and the second potential source being coupled to each of the first plurality of minimum impedance current paths.

7. A converter in accordance with claim 6, wherein each of the third plurality of current paths includes a resistor of value different from the values of resistors in the other ones of the third plurality of current paths, the value of each such resistor determining the constant value of the continuously flowing current provided thereby.

8. A converter in accordance with claim 6, further including a first plurality of resistors of substantially equal value coupled in respective ones of the third plurality of current paths; and a second plurality of resistors of substantially equal value and approximately half the value of the first plurality of resistors coupled between respective ones of the third plurality of current paths and the first potential source.

9. In an analog-to-digital converter of the successive approximation type wherein analog currents are successively compared in a comparator with a reference current to provide digital representations of the analog currents, a circuit for providing the reference current comprising a network having a plurality of terminals therein, means coupled to the network for providing a continuous flow of current of substantially constant magnitude into each of said terminals, a first plurality of circuit paths coupled to respective ones of the terminals, a second plurality of circuit paths coupling respective ones of the terminals to a common input of the comparator, means for normally directing the current flow at each terminal into the associated one of the first plurality of circuit paths, and means for alternatively directing the current flow at at least one of the terminals into the associated one of the second plurality of circuit paths, the first and second plurality of circuit paths having substantially negligible resistance such that the voltage and current magnitude at each terminal remains substantially constant regardless of which circuit path the current flow is directed into.

10. A circuit in accordance with claim 9, wherein the means for normally directing and the means for alternatively directing together comprise a plurality of diodes individually serially coupled in each of the second circuit paths between the common comparator input and respective ones of the terminals and poled to pass current in a direction from the terminal to the comparator input, means for normally reverse biasing the diodes to prevent current flow from the terminals to the common comparator input, and means for selectively removing the reverse bias from at least one of the diodes to direct the current flow at the associated terminal into the common comparator input.

11. A circuit in accordance with claim 10, wherein the means for normally reverse biasing comprises a plurality of transistors individually serially coupled in each of the first plurality of circuit paths, and means for normally rendering each of the transistors conductive; and wherein the means for selectively removing the reverse bias comprises means coupled to the base terminal of each transistor for selectively rendering the transistor nonconductive.

12. A circuit in accordance with claim 9, wherein said network comprises a ladder network of resistors having a first plurality of resistors of substantially equal value serially coupled to form one leg of the ladder network, a lead forming the opposite leg of the ladder network, and a second plurality of resistors of substantially equal value and approximately twice the value of the first plurality of resistors, one end of each of the second plurality of resistors being coupled to the junction between a respective pair of the first plurality of resistors; wherein said means for providing a continuous flow of current includes a constant current source coupled to the first plurality of resistors; wherein said plurality of terminals are located at the end of each of the second plurality of resistors opposite said one end; and wherein the first plurality of circuit paths comprises means coupling each of the terminals to said lead.

13. A circuit in accordance with claim 12, wherein the means for normally directing and the means for selectively directing together comprise a plurality of transistors, each having its emitter and collector leads serially coupled in a respective one of the first plurality of circuit paths; a plurality of diodes serially coupled in respective ones of the second plurality of circuit paths between the associated terminal and the common comparator input, means coupled to the base leads of the transistors for normally rendering the transistors conductive, and means coupled to the base leads of the transistors for selectively rendering one or more of the transistors nonconductive, conduction of each of the transistors reverse biasing the associated diode to prevent current flow from the associated terminal to the common comparator input, the nonconduction of each of the transistors forward biasing the associated diode to direct the current flow at the associated terminal into the common comparator input.

References Cited

UNITED STATES PATENTS

| | | | |
|---|---|---|---|
| 2,733,432 | 1/1956 | Breckman | 340—347 |
| 2,754,503 | 7/1956 | Forbes | 340—347 |
| 2,965,891 | 12/1960 | Martin | 340—347 |
| 3,064,191 | 11/1962 | Dever et al. | 340—347X |
| 3,100,298 | 8/1963 | Fluhr | 340—347 |
| 3,182,303 | 5/1965 | Howe | 340—347 |
| 3,247,507 | 4/1966 | Moses | 340—347 |

MAYNARD R. WILBUR, Primary Examiner

G. R. EDWARDS, Assistant Examiner